United States Patent
Ogawa

(10) Patent No.: US 11,342,293 B2
(45) Date of Patent: May 24, 2022

(54) SEMICONDUCTOR APPARATUS AND EQUIPMENT

(71) Applicant: Canon Kabushiki Kaisha, Tokyo (JP)

(72) Inventor: Toshiyuki Ogawa, Abiko (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/038,177

(22) Filed: Sep. 30, 2020

(65) Prior Publication Data
US 2021/0104481 A1  Apr. 8, 2021

(30) Foreign Application Priority Data
Oct. 8, 2019  (JP) .............................. JP2019-185458

(51) Int. Cl.
| | |
|---|---|
| *H01L 25/065* | (2006.01) |
| *H01L 23/00* | (2006.01) |
| *H01L 25/16* | (2006.01) |
| *H01L 25/18* | (2006.01) |

(52) U.S. Cl.
CPC .............. *H01L 24/06* (2013.01); *H01L 24/03* (2013.01); *H01L 24/80* (2013.01); *H01L 25/0657* (2013.01); *H01L 25/167* (2013.01); *H01L 25/18* (2013.01); *H01L 2224/06102* (2013.01); *H01L 2224/80948* (2013.01)

(58) Field of Classification Search
CPC ... H01L 24/06; H01L 25/0657; H01L 25/167; H01L 25/18; H01L 24/03; H01L 24/80; H01L 2224/06102; H01L 2224/80948
USPC ........................................................ 257/777
See application file for complete search history.

(56) References Cited

U.S. PATENT DOCUMENTS

| | | |
|---|---|---|
| 2001/0030368 A1 | 10/2001 | Tasaka |
| 2002/0074611 A1 | 6/2002 | Koubuchi |
| 2002/0079556 A1 | 6/2002 | Ishikura |
| 2002/0123207 A1 | 9/2002 | Horie |
| 2002/0168833 A1 | 11/2002 | Ota |
| 2002/0175419 A1 | 11/2002 | Wang |
| 2003/0203619 A1 | 10/2003 | Abe |
| 2004/0084777 A1 | 5/2004 | Yamanoue |
| 2005/0023648 A1 | 2/2005 | Jung |
| 2005/0269702 A1 | 12/2005 | Otsuka |
| 2006/0017167 A1 | 1/2006 | Iguchi |

(Continued)

FOREIGN PATENT DOCUMENTS

| | | |
|---|---|---|
| JP | 09107028 A | 4/1997 |
| JP | 2003224098 A | 8/2003 |

(Continued)

*Primary Examiner* — Didarul A Mazumder
(74) *Attorney, Agent, or Firm* — Venable LLP

(57) ABSTRACT

A semiconductor apparatus includes included first and second semiconductor components which are stacked on each other. The first component includes a first insulating layer and a first plurality of metal pads. The second component includes a second insulating layer and a second plurality of metal pads. Each of the first plurality of metal pads and each of the second plurality of metal pads are bonded to each other to form each of a plurality of bonding portions. First and second openings along an edge of the apparatus and passing through a bonding face between the first and second insulating layer are formed in the apparatus. A first bonding portion between the first opening and the second opening of the plurality of bonding portions is arranged in a distinctive location.

21 Claims, 8 Drawing Sheets

(56) References Cited

U.S. PATENT DOCUMENTS

| | | |
|---|---|---|
| 2006/0049056 A1 | 3/2006 | Wang |
| 2007/0221957 A1 | 9/2007 | Kitajima |
| 2009/0152674 A1 | 6/2009 | Uchida |
| 2010/0007030 A1 | 1/2010 | Koike |
| 2013/0062777 A1 | 3/2013 | Ogata |
| 2013/0099098 A1 | 4/2013 | Kobayashi |
| 2013/0105663 A1* | 5/2013 | Endo ................. H01L 27/14634 250/206 |
| 2013/0105667 A1 | 5/2013 | Kobayashi |
| 2013/0105924 A1 | 5/2013 | Kobayashi |
| 2013/0112849 A1 | 5/2013 | Shimotsusa |
| 2014/0145338 A1 | 5/2014 | Fujii |
| 2015/0380457 A1 | 12/2015 | Fujii |
| 2016/0126285 A1 | 5/2016 | Kobayashi |
| 2016/0233264 A1 | 8/2016 | Kagawa |
| 2019/0006399 A1 | 1/2019 | Otake |
| 2019/0252443 A1 | 8/2019 | Kobayashi |
| 2020/0020733 A1* | 1/2020 | Fujii ................. H01L 21/76877 |
| 2020/0035736 A1* | 1/2020 | Nagahama ........ H01L 21/76843 |

FOREIGN PATENT DOCUMENTS

| | | |
|---|---|---|
| JP | 2005150389 A | 6/2005 |
| JP | 2006041114 A | 2/2006 |
| JP | 2006165040 A | 6/2006 |
| JP | 2006339406 A | 12/2006 |
| JP | 2007294783 A | 11/2007 |
| JP | 2008041984 A | 2/2008 |
| JP | 2010287638 A | 12/2010 |
| JP | 2017120939 A | 7/2017 |
| WO | 19124112 A1 | 6/2019 |

* cited by examiner

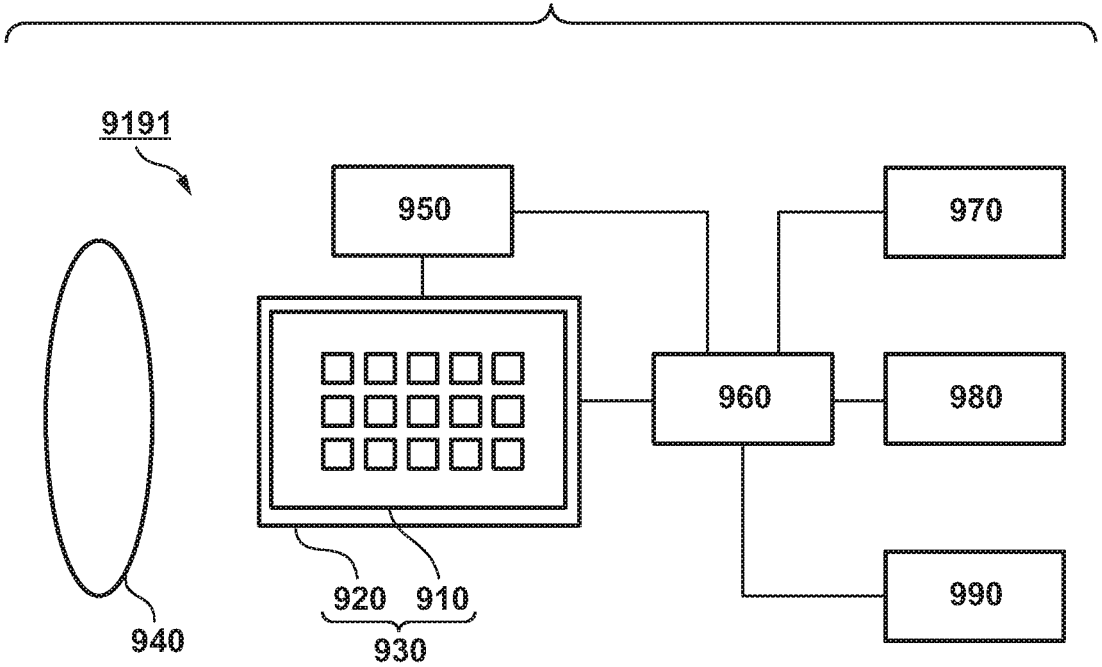

SEMICONDUCTOR APPARATUS AND EQUIPMENT

BACKGROUND OF THE INVENTION

Field of the Invention

The present disclosure relates to a semiconductor apparatus and an equipment.

Description of the Related Art

Japanese Patent Laid-Open No. 2017-120939 describes that a semiconductor apparatus having a three-dimensional structure is formed by stacking two semiconductor components each including elements and a wiring structure. In this semiconductor apparatus, electrodes are formed in the respective bonding faces of the two semiconductor components, and the elements of the two semiconductor components are electrically connected by bonding the electrodes.

Metal pads in the bonding face of the semiconductor component can be formed using a wiring forming technique generally known as a damascene method. For example, the metal pads are formed by forming grooves in an insulating layer that forms the bonding face of the semiconductor component, performing copper plating from above the grooves, and removing the copper other than the copper in the grooves using CMP (Chemical Mechanical Polishing). When the face with the metal pads formed therein at an uneven density is polished by CMP, a high density portion can be excessively polished. As a result, the bonding face of the semiconductor component may not be planarized, and when the two semiconductor components are stacked, an internal space may be generated between them. After stacking, when dicing the semiconductor components or forming an opening in the semiconductor component, if the internal space communicates with the outside, water or a foreign substance in the atmosphere may enter the internal space and the metal pads may corrode.

SUMMARY OF THE INVENTION

Some aspects of the present disclosure provide a technique for suppressing the communication of the internal space surrounded by two semiconductor components stacked on each other with the outside.

According to an embodiment, semiconductor apparatus comprises: a first semiconductor component including a first insulating layer, and a first plurality of metal pads embedded in recess portions provided in the first insulating layer; and a second semiconductor component including a second insulating layer and a second plurality of metal pads embedded in recess portions provided in the second insulating layer, wherein the first semiconductor component and the second semiconductor component are stacked on each other such that the first insulating layer and the second insulating layer are bonded to each other, each of the first plurality of metal pads and each of the second plurality of metal pads are bonded to each other to form each of a plurality of bonding portions, a first opening and a second opening each passing through a bonding face between the first insulating layer and the second insulating layer are formed in the semiconductor apparatus, the semiconductor apparatus includes edges surrounding the plurality of bonding portions, the first opening and the second opening are arranged along an edge of the semiconductor apparatus, the plurality of bonding portions include a first bonding portion between the first opening and the second opening, and any of the plurality of bonding portions is not located between the first bonding portion and the first opening in a direction parallel to the edge, and on the bonding face, letting Wd be a width of the first bonding portion in the direction parallel to the edge, Wo be a width of the first opening in the direction parallel to the edge, Doo be a distance between the first opening and the second opening, Dod be a distance between the first opening and the first bonding portion, and Doe be a distance between the first opening and the edge, Doo<2×Wo, Doe<2×Wo, and Dod>Wd are satisfied.

Further features of the present disclosure will become apparent from the following description of exemplary embodiments (with reference to the attached drawings).

BRIEF DESCRIPTION OF THE DRAWINGS

FIG. 9 is a schematic view for explaining an equipment according to an embodiment of the present disclosure.

DESCRIPTION OF THE EMBODIMENTS

Figure 1:
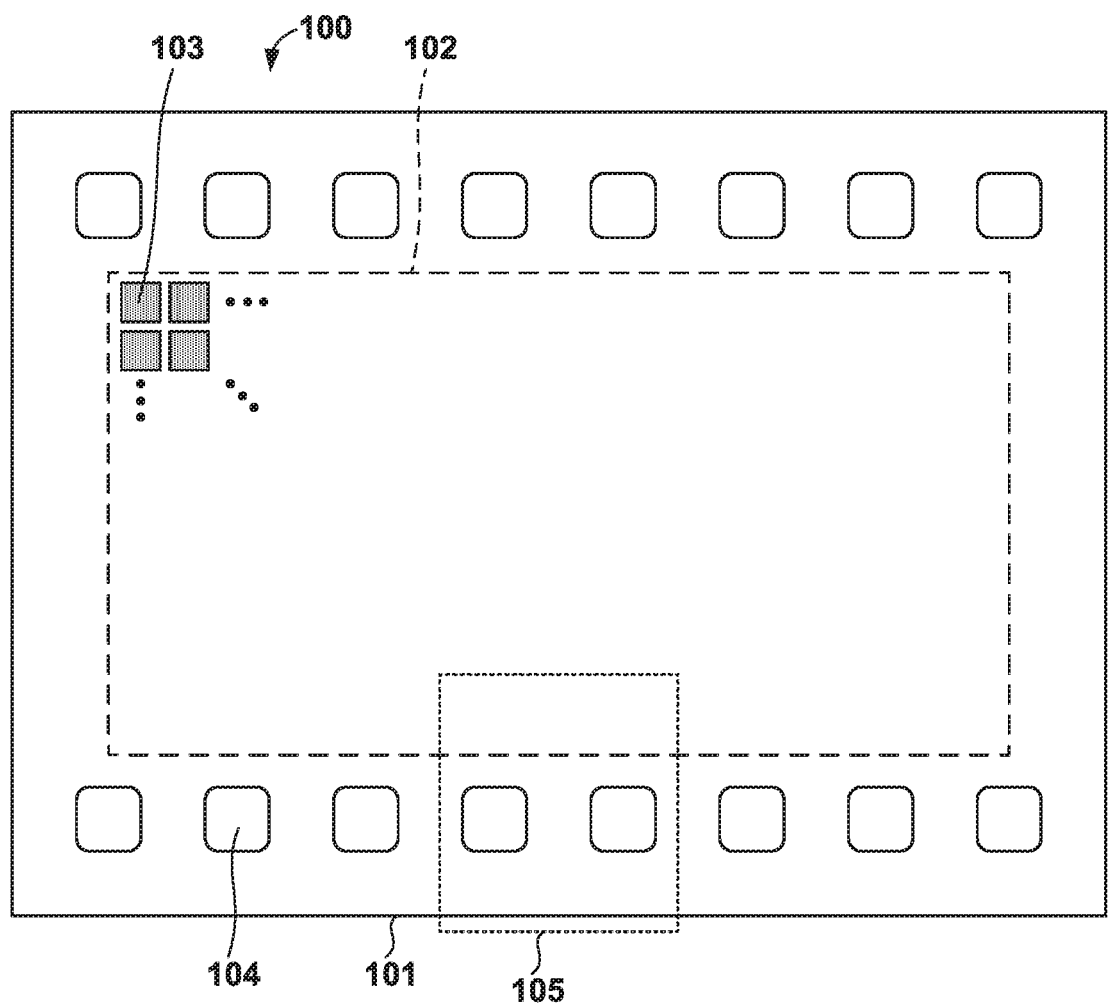
FIG. 1 is a schematic view for explaining an example of the structure of a solid-state imaging apparatus according to an embodiment of the present disclosure.

Hereinafter, embodiments will be described in detail with reference to the attached drawings. Note, the following embodiments are not intended to limit the scope of the claimed invention. Multiple features are described in the embodiments, but limitation is not made a disclosure that requires all such features, and multiple such features may be combined as appropriate. Furthermore, in the attached drawings, the same reference numerals are given to the same or similar configurations, and redundant description thereof is omitted.

First Embodiment

With reference to FIG. 1, an example of the structure of a semiconductor apparatus 100 according to the first embodiment of the present disclosure will be described. FIG. 1 is a plan view of the semiconductor apparatus 100. FIG. 1 shows a photoelectric conversion apparatus (for example, a solid-state imaging apparatus) as an example of the semiconductor apparatus 100. The semiconductor apparatus 100 includes, in its center, a pixel region 102 in which a plurality of pixels 103 are arranged in a two-dimensional array. Each pixel 103 may include, for example, a photoelectric conversion element such as a photodiode, and a switch element such as a transistor.

The semiconductor apparatus 100 further includes a plurality of openings 104. In FIG. 1, only one opening 104 is given a reference numeral, but all the 16 elements having the same shape as the opening 104 are the openings 104. As will be described later, the opening 104 exposes the bonding pad of the semiconductor apparatus 100. Some of the plurality of openings 104 are arranged along one edge 101 of the semiconductor apparatus 100. In FIG. 1, eight openings 104 are arranged along the edge 101. The edge of the semiconductor apparatus 100 is obtained by dicing a semiconductor wafer to divide the semiconductor apparatus 100 into chips. The distance between each opening 104 arranged along the edge 101 and the edge 101 is smaller than the distance between the pixel region 102 and the edge 101. In addition, the other openings 104 of the plurality of openings 104 are arranged along the edge on the opposite side of the edge 101. In the example shown in FIG. 1, the plurality of openings 104 are arranged along the two edges. Instead, the plurality of openings 104 may be arranged along only one edge, or may be arranged along three or four edges.

Figure 2A:
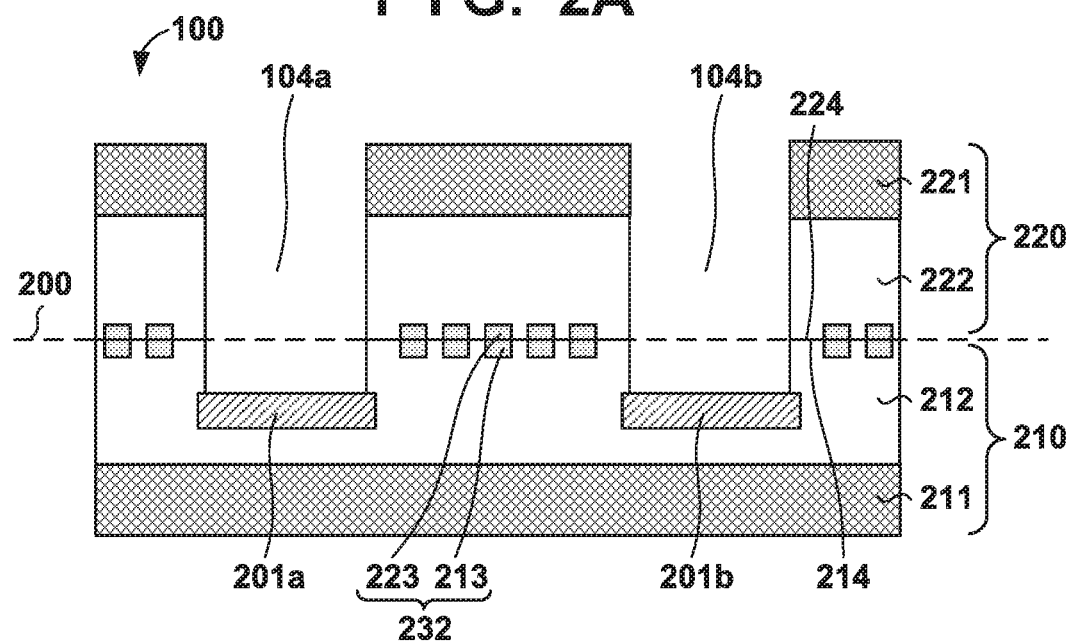
FIGS. 2A and 2B are schematic views for explaining an example of the structure of a semiconductor apparatus according to the embodiment of the present disclosure.
Figure 2B:
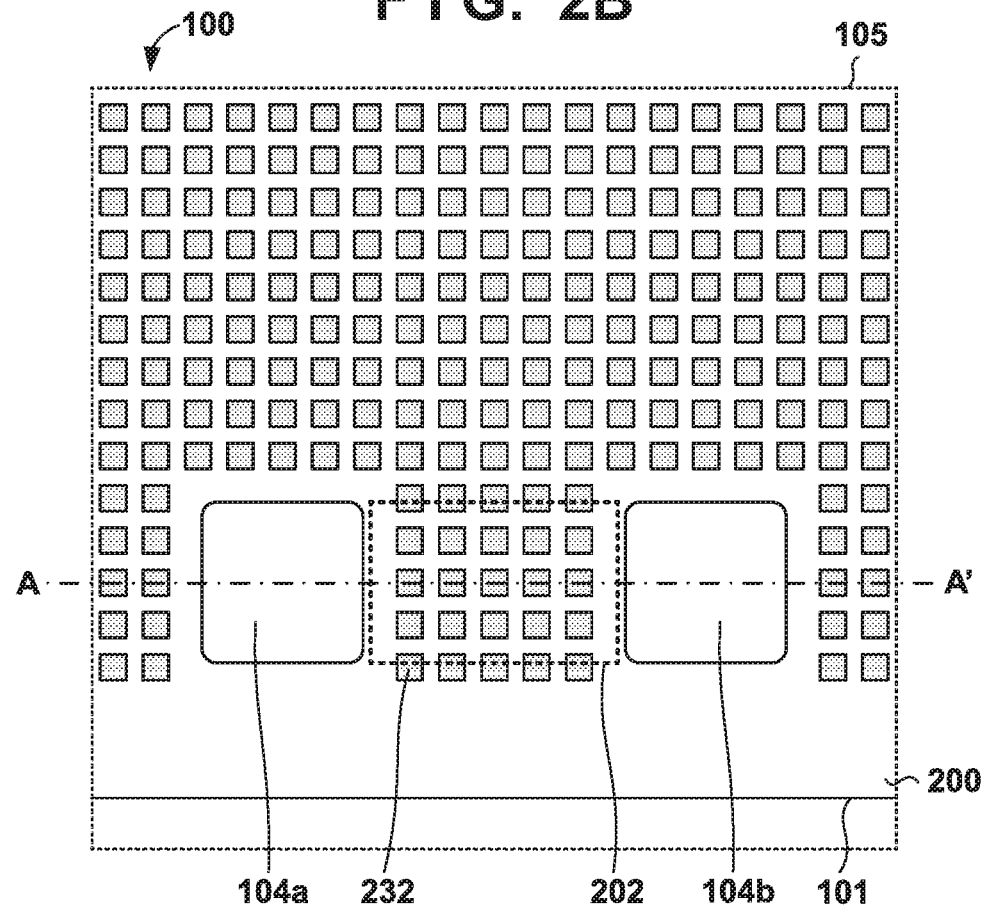

With reference to FIGS. 2A and 2B, the details of the structure of the semiconductor apparatus 100 will be described. FIG. 2A is a sectional view of the semiconductor apparatus 100 in a region 105 shown in FIG. 1. FIG. 2B shows the structure of the semiconductor apparatus 100 on a bonding face 200 between a semiconductor component 210 and a semiconductor component 220. FIG. 2A is a sectional view taken along a line A-A' in FIG. 2B.

The semiconductor apparatus 100 includes the semiconductor component 210 and the semiconductor component 220. The face of the semiconductor component 210 on the semiconductor component 220 side is referred to as a bonding face 214. The face of the semiconductor component 220 on the semiconductor component 210 side is referred to as a bonding face 224. The semiconductor component 210 and the semiconductor component 220 are bonded in a state in which they are stacked such that the bonding face 214 and the bonding face 224 face each other.

The semiconductor component 210 includes a semiconductor layer 211, and an insulating layer 212 which covers one face of the semiconductor layer 211. The semiconductor layer 211 is formed of, for example, a semiconductor such as silicon. The insulating layer 212 is formed of, for example, an insulator such as a silicon compound. The insulating layer 212 may be a multilayer film, for example, a multilayer film including at least two kinds of silicon compound layers among three kinds of silicon compound layers including a silicon oxide layer, a silicon nitride layer, and a silicon carbide layer. Circuit elements and wiring members (neither is shown) are formed in the semiconductor component 210. Since the circuit elements and the wiring structure may have an existing arrangement, a description thereof will be omitted. When the semiconductor apparatus 100 is a photoelectric conversion apparatus, a photoelectric convertor may be provided in the semiconductor component 210.

The face of the insulating layer 212 farther from the semiconductor layer 211 becomes the bonding face 214 of the semiconductor component 210. A plurality of metal pads 213 are embedded in the recess portions provided in the bonding face 214. Although only one metal pad 213 is given a reference numeral in FIG. 2A, all the similarly hatched members in the semiconductor component 210 are the metal pads 213. The metal pad 213 is embedded in the recess portions provided in the bonding face 214 of the insulating layer 212. The metal pad 213 is formed of, for example, a metal such as copper. The semiconductor component 210 further includes bonding pads 201a and 201b in the insulating layer 212. Each of the bonding pads 201a and 201b is formed of a metal such as copper, aluminum, or tungsten. The bonding pads 201a and 201b may be a part of a metal pattern in the same layer as the wiring layer.

The semiconductor component 220 includes a semiconductor layer 221, and an insulating layer 222 which covers one face of the semiconductor layer 221. The semiconductor layer 221 is formed of, for example, a semiconductor such as silicon. The insulating layer 222 is formed of, for example, an insulator such as a silicon compound. The insulating layer 222 may be a multilayer film, for example, a multilayer film including at least two kinds of silicon compound layers among three kinds of silicon compound layers including a silicon oxide layer, a silicon nitride layer, and a silicon carbide layer. Circuit elements and wiring members (neither is shown) are formed in the semiconductor component 220. Since the circuit elements and the wiring structure may have an existing arrangement, a description thereof will be omitted. When the semiconductor apparatus 100 is a photoelectric conversion apparatus, a signal processing unit that processes a signal based on electric charges of the above-described photoelectric converter may be provided in the semiconductor component 220.

The face of the insulating layer 222 farther from the semiconductor layer 221 becomes the bonding face 224 of the semiconductor component 220. A plurality of metal pads 223 are embedded in the recess portions provided in the bonding face 224. Although only one metal pad 223 is given a reference numeral in FIG. 2A, all the similarly hatched members in the semiconductor component 220 are the metal pads 223. The metal pad 223 is embedded in the recess portions provided in the bonding face 224 of the insulating layer 222. The metal pad 223 is formed of, for example, a metal such as copper.

An openings 104a exposing the bonding pad 201a and an opening 104b exposing the bonding pad 201b are formed from the semiconductor layer 221 side of the semiconductor component 220 in the semiconductor apparatus 100. The openings 104a and 104b are two adjacent openings among the plurality of openings 104. A bonding wire (not shown) is connected to the bonding pads 201a and 201b through the openings 104a and 104b. All of the plurality of openings 104 pass through the bonding face 200.

A plurality of bonding portions 232, each of which is formed by bonding one of the first plurality of metal pads 213 to one of the second plurality of metal pads 223, are arranged in the bonding face 200. The plurality of metal pads 213 may have a one-to-one conespondence with the plurality of metal pads 223. Alternatively, there may be the metal pad 213 that is not bonded to the metal pad 223, and the metal pad 223 that is not bonded to the metal pad 213. In the following description, for the sake of descriptive convenience, it is assumed that the plurality of metal pads 213 have a one-to-one conespondence with the plurality of metal pads 223, and all the pairs form the bonding portions 232. That is, the metal pads 213 have a one-to-one correspondence with the bonding portions 232, and the metal pads 223 have a one-to-one correspondence with the bonding portions 232. The plurality of bonding portions 232 are surrounded by the edges (including the edge 101) of the semiconductor apparatus 100.

The plurality of bonding portions 232 may include normal bonding portions and dummy bonding portions. The normal bonding portion is the bonding portion used for power supply or signal transmission. The normal bonding portion may be electrically connected to the circuit element or wiring member in the semiconductor component 210 and the circuit element or wiring member in the semiconductor component 220. The dummy bonding portion is the metal pad that is used for neither power supply nor signal transmission. The dummy bonding portion may not be electrically connected to the circuit element or wiring member in the semiconductor component 210 and the circuit element or wiring member in the semiconductor component 220.

The plurality of bonding portions 232 are arranged over the entire bonding face 200. For example, some of the plurality of bonding portions 232 are arranged in a region overlapping with the pixel region 102. Further, some of the plurality of bonding portions 232 are arranged in a region 202 between the opening 104a and the opening 104b. Note that the plurality of bonding portions 232 are not arranged in the openings 104a and 104b and the vicinity thereof. Further, in this embodiment, the plurality of bonding portions 232 are not arranged in the vicinity of the edge 101. The vicinity of the edge 101 may be, for example, a range having a distance from the edge 101 similar to the distance from the edge 101 to the opening 104a. The plurality of bonding portions 232 may be arranged at a uniform density (for example, at equal intervals). With this arrangement, the bonding strength between the two semiconductor components 210 and 220 is increased.

The region 202 between the opening 104a and the opening 104b is a region surrounded by a first common circumscribed line circumscribing the opening 104a and the opening 104b, a second common circumscribed line circumscribing the opening 104a and the opening 104b, the opening 104a, and the opening 104b. The common circumscribed line is a tangential line from which the two openings 104a and 104b are on the same side. If the two openings 104a and 104b are on opposite sides of the tangential line, the tangential line is a common inscribed line, which is distinguished from the common circumscribed line. In the region 202, the first common circumscribed line and the second common circumscribed line do not intersect with each other. If the opening 104a and the opening 104b are congruent, the first common circumscribed line and the second common circumscribed line can be parallel.

Figure 3:
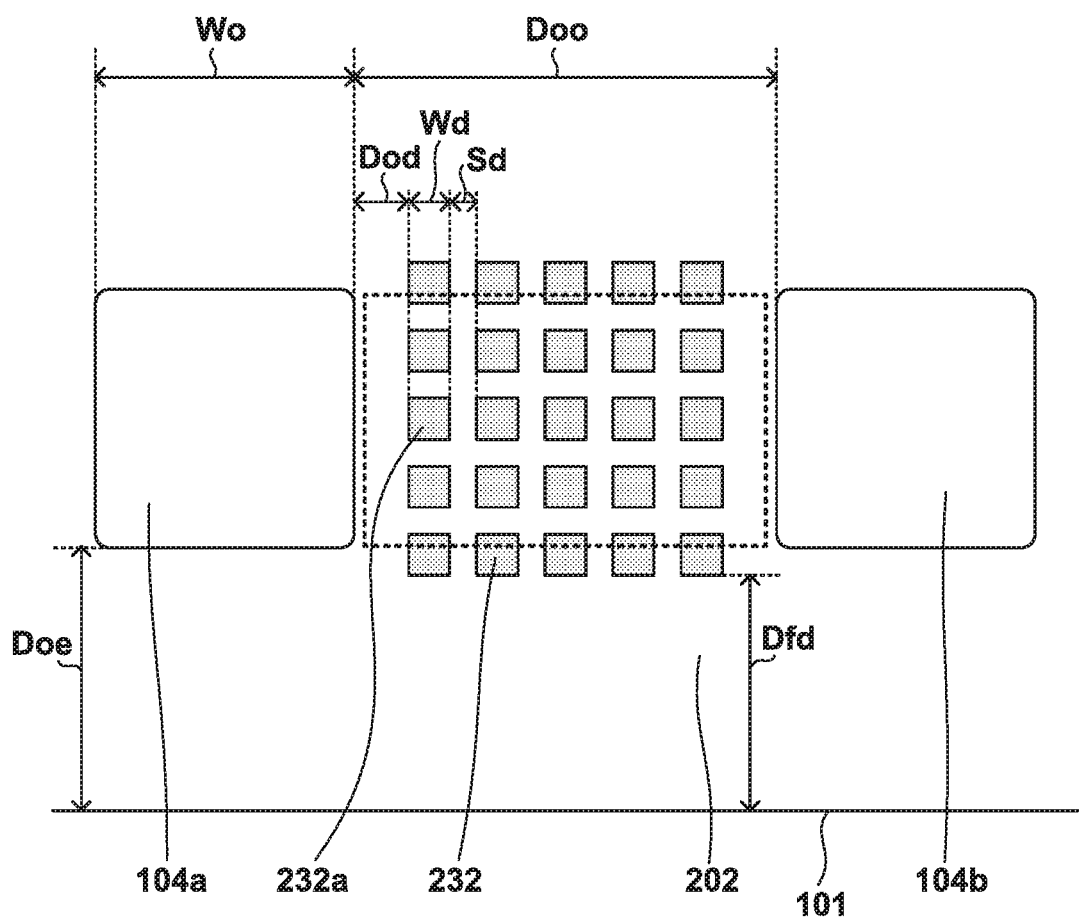
FIG. 3 is a schematic view for explaining an example of the sizes of respective members of the semiconductor apparatus according to the embodiment of the present disclosure.

With reference to FIG. 3, an example of the sizes of the respective elements of the semiconductor apparatus 100 will be described. FIG. 3 is a view focusing on a part of FIG. 2B. Wo represents the width of the opening 104a on the bonding face 200. Wo may be the width of the opening 104a in a direction parallel to the edge 101. In this specification, if two directions are parallel, it is assumed that the angle formed by the two directions is 0°. However, this may be the idea including an error in the embodiment and, for example, the angle formed by the two directions along each other may be equal to or smaller than 5°. If the opening 104a has a rectangular (including square) contour, Wo may be the length of a side in the direction parallel to the edge 101. If the opening 104a has a square contour, Wo may be the length of one side of the square. Other openings 104 may have the same size as the opening 104a.

Wd represents the width of the bonding portion 232 on the bonding face 200. Wd may be the width of the bonding portion 232 in the direction parallel to the edge 101. If the bonding portion 232 has a rectangular (including square) contour, Wd may be the length of a side in the direction parallel to the edge 101. If the bonding portion 232 has a square contour, Wd may be the length of one side of the square.

Doo represents the distance between the two openings 104a and 104b adjacent to each other on the bonding face 200. Doo may be the distance in the direction parallel to the edge 101. Doo may be the shortest distance between the two openings 104a and 104b.

Among one or more bonding portions 232 included in the region 202, no other bonding portion 232 is located between the bonding portion 232a and the opening 104a. In this example, the bonding portion closest to the opening 104a among the one or more bonding portions 232 included in the region 202 is indicated as the bonding portion 232a. However, it is not essential that the bonding portion closest to the opening 104a among the one or more bonding portions 232 included in the region 202 is the bonding portion 232a. It is also possible to arrange another bonding portion 232 at a position which is closer to the opening 104a than the bonding portion 232a but not located between the bonding portion 232a and the opening 104a. However, if the bonding portion 232 closer to the opening 104a than the bonding portion 232a does not satisfy the positional conditions of the bonding portion 232 as described below, the effect can be lower than in a case in which the following conditions are satisfied. Therefore, the bonding portion 232a may be the bonding portion closest to the opening 104a among the one or more bonding portions 232 included in the region 202. Dod represents the distance between the opening 104a and the bonding portion 232a on the bonding face 200. Dod may be the distance in the direction parallel to the edge 101. Dod may be the shortest distance between the opening 104a and the bonding portion 232a.

Sd represents the distance between two bonding portions 232 adjacent to each other on the bonding face 200. The two bonding portions 232 adjacent to each other may be adjacent in the direction parallel to the edge 101. Sd may be the distance in the direction parallel to the edge 101. Sd may be the shortest distance between the two bonding portions 232 adjacent to each other.

Doe represents the distance between the opening 104a and the edge 101 on the bonding face 200. Doe may be the distance in a direction perpendicular to the edge 101. In this specification, if two directions are orthogonal, it is assumed that the angle formed by the two directions is 90°. However, this may be the idea including an error in the embodiment and, for example, the angle formed by the two directions intersecting with each other may be between 85° (inclusive) and 90° (inclusive). Doe may be the shortest distance between the opening 104a and the edge 101.

In this embodiment, as shown in FIG. 1, some of the plurality of openings 104 are arranged along the edge 101 of the semiconductor apparatus 100. This state may be represented as, using the above-described lengths concerning the openings 104, Doo<2×Wo and Doe<2×Wo. The width Wo of the opening 104a may satisfy 50 µm≤Wo≤200 µm or 80 µm≤Wo≤120 µm. The width Wo may be 100 µm, for example. The distance Doo between the openings 104a and 104b may satisfy 50 µm≤Doo≤250 µm or 120 µm≤Doo≤160 µm. The distance Doo may be 140 µm, for example. In order to arrange a sufficient number of bonding portions 232 between the opening 104a and the opening 104b, Wo<Doo may be satisfied. The distance Doe between the opening 104a and the edge 101 may satisfy 50 μm≤Doe≤200 μm, 70 μm≤Doe≤150 μm, or Doe≤Doo.

The width Wd of the bonding portion 232 may satisfy 1 μm≤Wd≤10 μm or 1 μm≤Wd≤5 μm. The width Wd may be 3 μm, for example. The distance Sd between the bonding portions 232 may satisfy 1 μm≤Sd≤10 μm or 1 μm≤Sd≤5 μm. The distance Sd may be 3 μm, for example. The sizes as described above facilitate the arrangement of the plurality of bonding portions 232 at a uniform density in a small region such as the region 202. With this arrangement, the bonding strength between the two semiconductor components 210 and 220 in the region 202 is increased. Further, from the viewpoint of the bonding strength between the bonding faces 214 and 224, the density of the bonding portions 232 may be smaller than 0.3, that is, may satisfy $Wd^2/(Wd+Sd)^2 < 0.3$.

As will be described later, if Dod is too small, the internal space formed between the two semiconductor components 210 and 220 may communicate with the opening 104a. Therefore, Dod>Wd may be satisfied, or Dod≥Wd+Sd may be satisfied. Further, in order to increase the bonding strength in the vicinity of the opening 104a, Dod<Doo/4, Dod<3×(Wd+Sd), or Dod≤2×(Wd+Sd) may be satisfied. Furthermore, 3 μm≤Dod≤30 μm, 6 μm≤Dod≤20 μm, or 9 μm≤Dod≤12 μm may be satisfied. For example, when Wd=Sd=3 μm, if 9 μm≤Dod≤12 μm is satisfied, 1.5×(Wd+Sd)≤Dod≤2×(Wd+Sd) is satisfied. In order to arrange a sufficient number of bonding portions 232 between the opening 104a and the opening 104b, Doo>10×(Wd+Sd) may be satisfied. For example, it is possible to arrange, between the opening 104a and the opening 104b, five or more bonding portions 232 along the direction connecting the opening 104a and the opening 104b. Further, it is possible to arrange, between the opening 104a and the opening 104b, ten or more bonding portions 232 along the direction connecting the opening 104a and the opening 104b.

In the example described above, the relationship between the opening 104a and the bonding portion 232a has been described. The similar relationship may be established for other openings and other bonding portions. For example, the bonding portion closest to the opening 104b among the one or more bonding portions 232 included in the region 202 is indicated as a bonding portion 232a'. The bonding portion 232a' is an example of the bonding portion 232, among the one or more bonding portions 232 included in the region 202, which has no other bonding portion 232 located between the opening 104b and itself. The relationship similar to that between the opening 104a and the bonding portion 232a may be established between the opening 104b and the bonding portion 232a'. In that case, Wd, Wo, Dod, Doo, and Doe may be replaced with Wd', Wo', Dod', Doo', and Doe', respectively. Further, the width of the bonding portion 232 in the direction different from Wd may be represented as Wd".

Figure 4A:
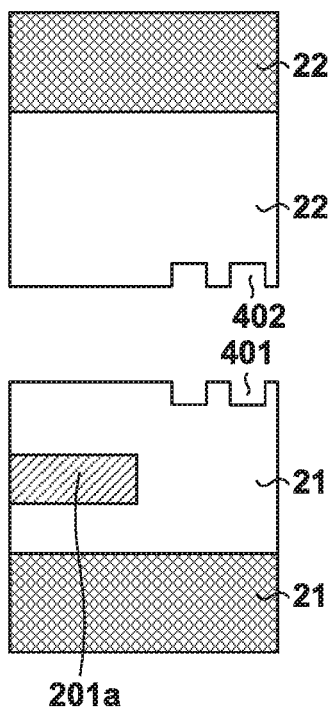
FIGS. 4A to 4E are schematic views for explaining an example of a manufacturing method of the semiconductor apparatus according to the embodiment of the present disclosure.

With reference to FIGS. 4A to 4E, an example of a manufacturing method of the semiconductor apparatus 100 will be described. Each of FIGS. 4A to 4E corresponds to the portion focusing on a part of the sectional view shown in FIG. 2A. As shown in FIG. 4A, the insulating layer 212 is formed on the semiconductor layer 211 with circuit elements formed therein. The bonding pad 201a and a wiring layer (not shown) are buried in the insulating layer 212. Then, grooves 401 for forming the plurality of metal pads 213 are formed in the surface of the insulating layer 212. The grooves 401 are formed by, for example, photolithography and dry etching. Similarly, the insulating layer 222 is formed on the semiconductor layer 221 with circuit elements formed therein. A wiring layer (not shown) is buried in the insulating layer 222. Then, grooves 402 for forming the plurality metal pads 223 are formed in the surface of the insulating layer 222.

Figure 4B:
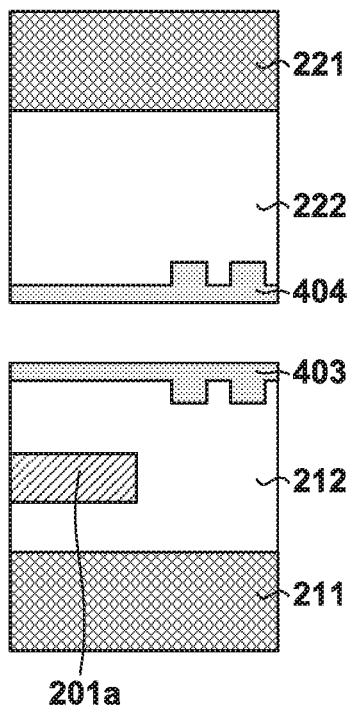

Then, as shown in FIG. 4B, the surface of the insulating layer 212 is covered by a metal layer 403. The metal layer 403 is formed of copper, for example. The metal layer 403 is formed by, for example, forming a seed layer by sputtering, and then using plating to make the seed layer grown to have a sufficient film thickness. Parts of the metal layer 403 enter the grooves 401. Similarly, the surface of the insulating layer 222 is covered by a metal layer 404.

Figure 4C:
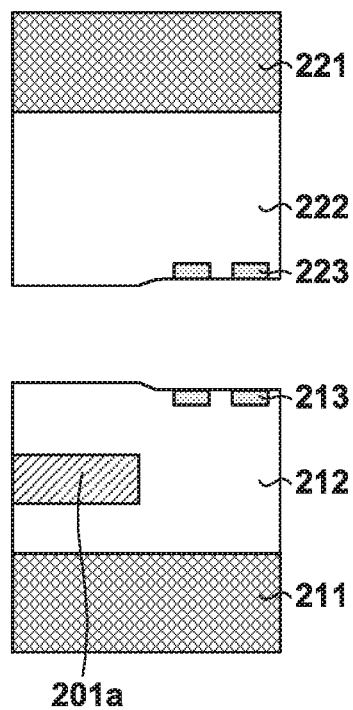

Then, as shown in FIG. 4C, by performing CMP on the metal layer 403, a part of the metal layer 403 other than the parts having entered the grooves 401 is removed. Thus, the remaining parts of the metal layer 403 become the plurality of metal pads 213. Since the polishing rate is higher in the region of the insulating layer 212 where the grooves 401 have been formed than in the region where no groove 401 has been formed, the thickness of the insulating layer 212 in the region where the metal pads 213 have been formed is smaller than that in the other region. Such a variation in polishing amount can be called erosion. For the sake of descriptive convenience, the variation in thickness of the insulating layer 212 is emphasized in FIG. 4C. Similarly, by performing CMP on the metal layer 404, a part of the metal layer 404 other than the parts having entered the grooves 402 is removed. Thus, the remaining parts of the metal layer 404 become the plurality of metal pads 223. Also in the insulating layer 222, the thickness of the insulating layer 222 in the region where the metal pads 223 have been formed is smaller than that in the other region.

Figure 4D:
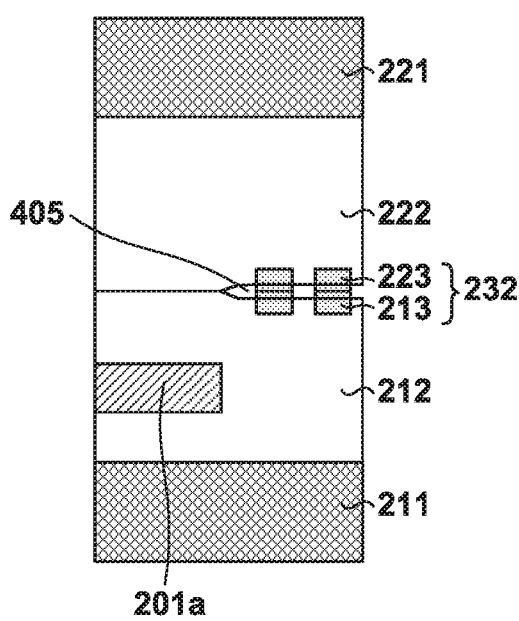

Then, as shown in FIG. 4D, the insulating layer 212 and the insulating layer 222 are stacked on each other such that the plurality of metal pads 213 and the plurality of metal pads 223 are bonded to each other. Thereafter, by performing annealing, the metal pads 213 and 223 expand, so that the metal pad 213 and the metal pad 223 are bonded to each other. Thus, the plurality of bonding portions 232 are formed. Since the surfaces of the insulating layers 212 and 222 hardly expand, an internal space 405 is formed between the insulating layer 212 and the insulating layer 222. The internal space 405 is entirely covered by the insulating layer 212 and the insulating layer 222. Some of the plurality of bonding portions 232 face the internal space 405. Thereafter, CMP or the like is performed on the insulating layers 211 and 221 to make them have desired thicknesses.

Figure 4E:
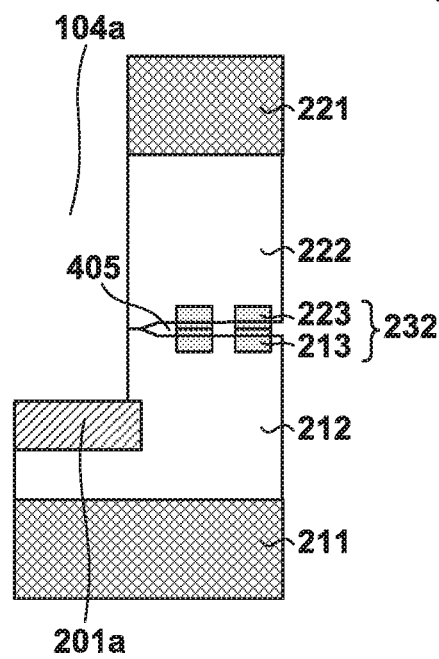

Then, as shown in FIG. 4E, the opening 104a is formed from the semiconductor layer 221 side so as to expose the bonding pad 201a. This opening 104a passes through the bonding face 200. Thereafter, the semiconductor apparatus thus formed is divided to form the semiconductor apparatus 100.

Figure 5A:
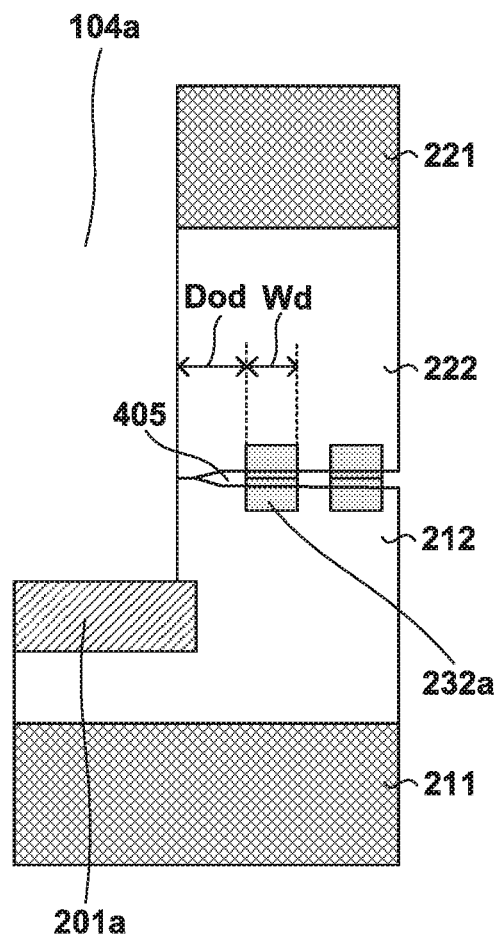
FIGS. 5A and 5B are schematic views for comparing the semiconductor apparatus according to the embodiment of the present disclosure with a semiconductor apparatus of a comparative example.
Figure 5B:
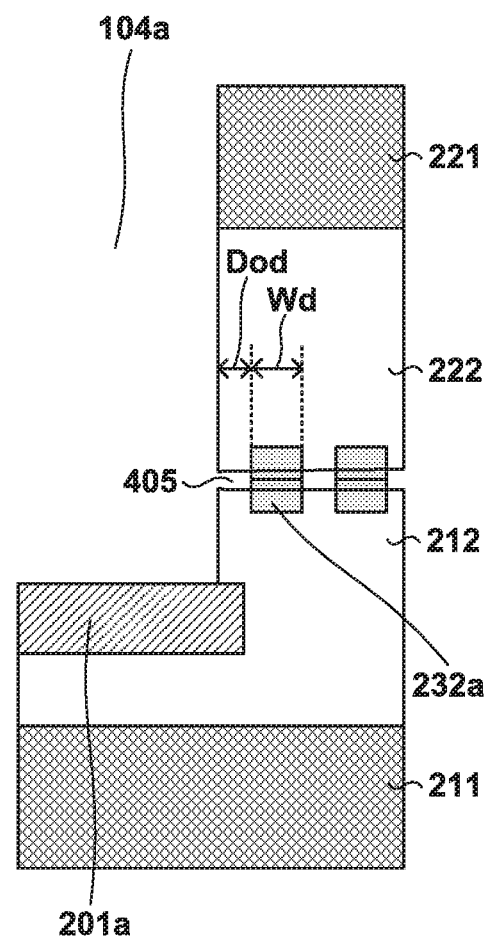

With reference to FIGS. 5A and 5B, the effect of this embodiment will be described. FIG. 5A corresponds to FIG. 4E. FIG. 5B shows a structure according to a comparative example. In the structure according to this embodiment shown in FIG. 5A, the distance Dod between the opening 104a and the bonding portion 232a is large to some extent (more specifically, Dod>Wd). Therefore, the opening 104a does not communicate with the internal space 405 (that is, they are separated by the insulating layer 212 and the insulating layer 222), so that water and foreign substances are less likely to enter the internal space 405 from the opening 104a. As a result, corrosion of the bonding portions 232 is suppressed.

On the other hand, in the structure according to the comparative example shown in FIG. 5B, the distance Dod between the opening 104a and the adjacent bonding portion 232 is small (more specifically, Dod<Wd). Therefore, the opening 104a communicates with the internal space 405, so that water and foreign substances are likely to enter the internal space 405 from the opening 104a. As a result, corrosion of the bonding portions 232 occurs.

As has been described above, according to this embodiment, it is possible to suppress the communication of the internal space 405 with the opening 104a caused by erosion while arranging the bonding portions 232 between the two openings 104 adjacent to each other. Therefore, it is possible to suppress a deterioration of the bonding portions 232 caused by corrosion while improving the bonding strength between the two semiconductor components 210 and 220. As a result, it is possible to provide the high-quality and inexpensive semiconductor apparatus 100.

Second Embodiment

Figure 6A:
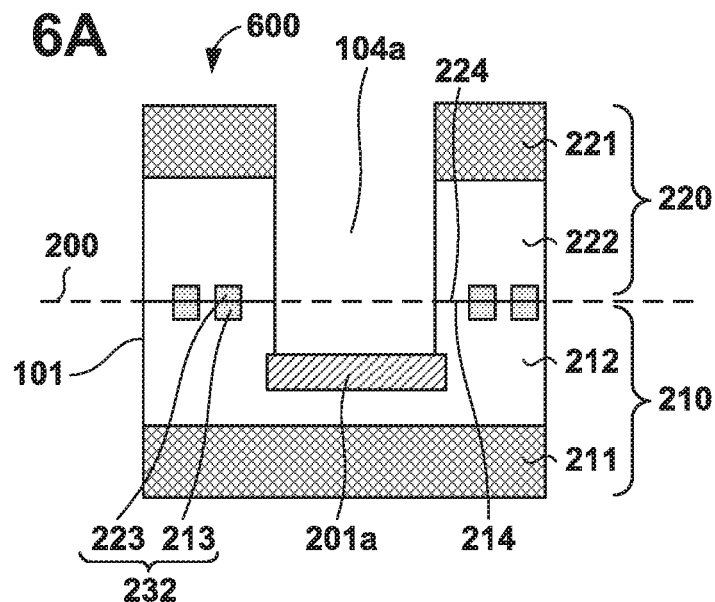
FIGS. 6A and 6B are schematic views for explaining an example of the structure of a semiconductor apparatus according to another embodiment of the present disclosure.
Figure 6B:
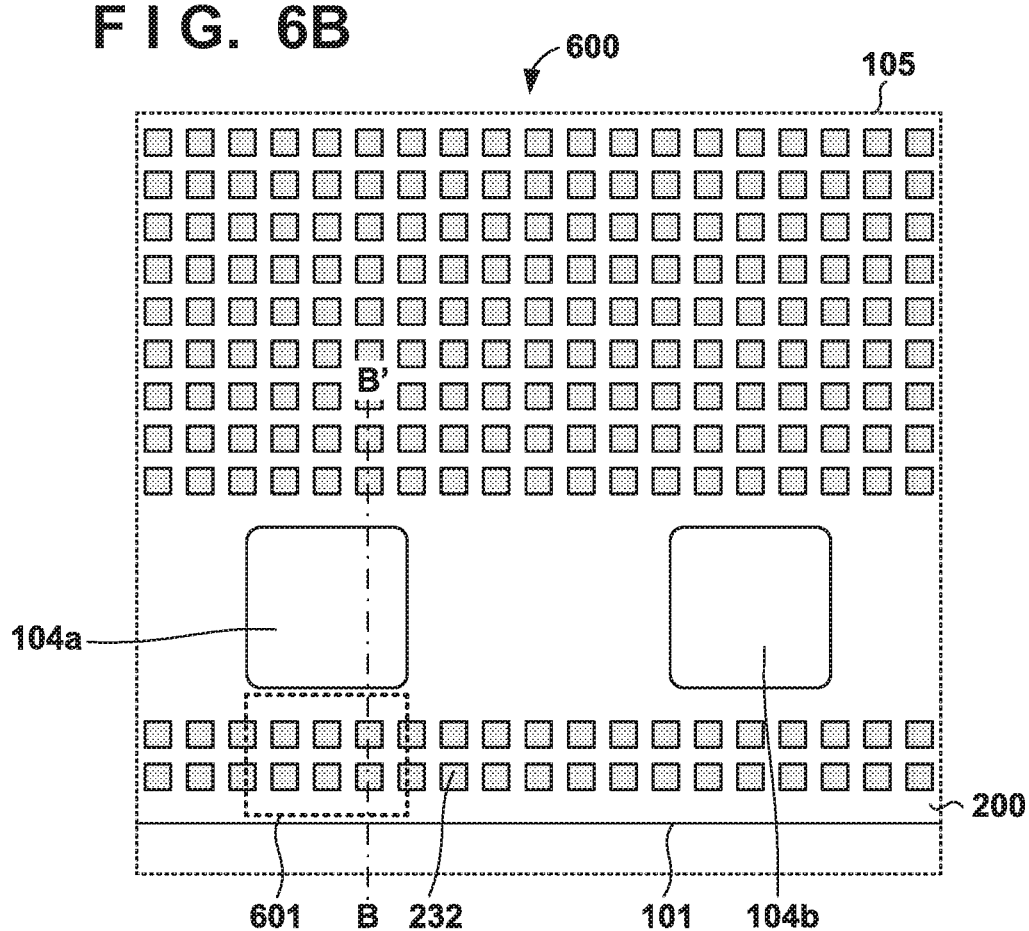

With reference to FIGS. 6A and 6B, an example of the structure of a semiconductor apparatus 600 according to the second embodiment of the present disclosure will be described. A repetitive description of components of the semiconductor apparatus 600 similar to those of the semiconductor apparatus 100 will be omitted. That is, unless otherwise stated, the above description of the semiconductor apparatus 100 also applies to the semiconductor apparatus 600.

FIG. 6A is a sectional view of the semiconductor apparatus 600 in the region 105 shown in FIG. 1. FIG. 6B shows the structure of the semiconductor apparatus 600 on a bonding face 200 between a semiconductor component 210 and a semiconductor component 220. FIG. 6A is a sectional view taken along a line B-B' in FIG. 6B.

A plurality of bonding portions 232 are arranged over the entire bonding face 200. For example, some of the plurality of bonding portions 232 are arranged in a region overlapping with the pixel region 102. In this embodiment, some of the plurality of bonding portions 232 are arranged in a region 601 between an opening 104a and an edge 101. Note that the plurality of bonding portions 232 are not arranged in the openings 104a and 104b and the vicinity thereof. Further, some of the plurality of bonding portions 232 are not arranged in the region 202 between the opening 104a and the opening 104b. The region 601 between the opening 104a and the edge 101 is a region surrounded by two circumscribed lines each perpendicular to the edge 101 and circumscribing the opening 104a, the opening 104a, and the edge 101.

Figure 7:
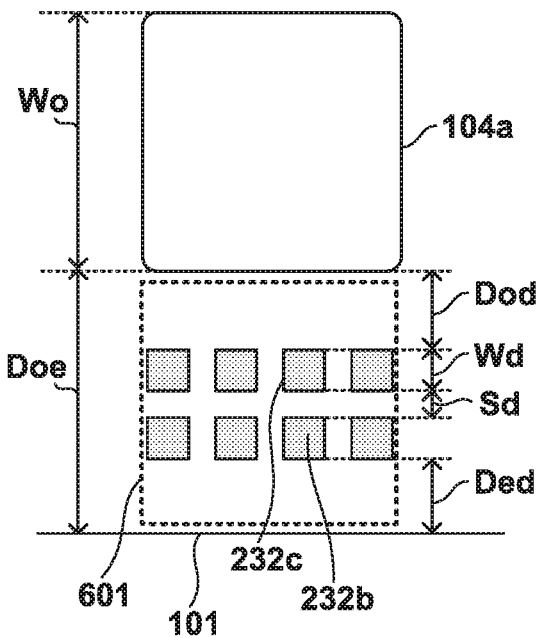
FIG. 7 is a schematic view for explaining an example of the sizes of respective members of the semiconductor apparatus according to the other embodiment of the present disclosure.

With reference to FIG. 7, an example of the sizes of the respective elements of the semiconductor apparatus 600 will be described. FIG. 7 is a view focusing on a part of FIG. 6B. Wo represents the width of the opening 104a on the bonding face 200. Wo may be the width of the opening 104a in a direction perpendicular to the edge 101. If the opening 104a has a rectangular (including square) contour, Wo may be the length of a side in the direction perpendicular to the edge 101. If the opening 104a has a square contour, Wo may be the length of one side of the square. Other openings 104 may have the same size as the opening 104a.

Wd represents the width of the bonding portion 232 on the bonding face 200. Wd may be the width of the bonding portion 232 in the direction perpendicular to the edge 101. If the bonding portion 232 has a rectangular (including square) contour, Wd may be the length of a side in the direction perpendicular to the edge 101. If the bonding portion 232 has a square contour, Wd may be the length of one side of the square.

Among one or more bonding portions 232 included in the region 601, no other bonding portion 232 is located between a bonding portion 232b and the edge 101. In this example, the bonding portion closest to the edge 101 among the one or more bonding portions 232 included in the region 601 is indicated as the bonding portion 232b. However, it is not essential that the bonding portion closest to the edge 101 among the one or more bonding portions 232 included in the region 601 is the bonding portion 232b. It is also possible to arrange another bonding portion 232 at a position which is closer to the edge 101 than the bonding portion 232b but not located between the bonding portion 232b and the edge 101. However, if the bonding portion 232 closer to the edge 101 than the bonding portion 232b does not satisfy the positional conditions of the bonding portion 232 as described below, the effect can be lower than in a case in which the following conditions are satisfied. Therefore, the bonding portion 232b may be the bonding portion closest to the edge 101 among the one or more bonding portions 232 included in the region 601. Ded represents the distance between the edge 101 and the bonding portion 232b on the bonding face 200. Ded may be the distance in the direction perpendicular to the edge 101. Ded may be the shortest distance between the edge 101 and the bonding portion 232b.

Among the one or more bonding portions 232 included in the region 601, no other bonding portion 232 is located between a bonding portion 232c and the opening 104a. In this example, the bonding portion closest to the opening 104a among the one or more bonding portions 232 included in the region 601 is indicated as the bonding portion 232c. However, it is not essential that the bonding portion closest to the opening 104a among the one or more bonding portions 232 included in the region 601 is the bonding portion 232c. It is also possible to arrange another bonding portion 232 at a position which is closer to the opening 104a than the bonding portion 232c but not located between the bonding portion 232c and the opening 104a. However, if the bonding portion 232 closer to the opening 104a than the bonding portion 232c does not satisfy the positional conditions of the bonding portion 232 as described below, the effect can be lower than in a case in which the following conditions are satisfied. Therefore, the bonding portion 232c may be the bonding portion closest to the opening 104a among the one or more bonding portions 232 included in the region 601. Dod represents the distance between the opening 104a and the bonding portion 232c on the bonding face 200. Dod may be the distance in the direction perpendicular to the edge 101. Dod may be the shortest distance between the opening 104a and the bonding portion 232c.

Sd represents the distance between two bonding portions 232 adjacent to each other on the bonding face 200. The two bonding portions 232 adjacent to each other may be adjacent in the direction perpendicular to the edge 101. Sd may be the distance in the direction perpendicular to the edge 101. Sd may be the shortest distance between the two bonding portions 232 adjacent to each other.

Doe represents the distance between the opening 104a and the edge 101 on the bonding face 200. Doe may be the distance in the direction perpendicular to the edge 101. Doe may be the shortest distance between the opening 104a and the edge 101.

In this embodiment, as shown in FIG. 1, some of the plurality of openings 104 are arranged along the edge 101 of the semiconductor apparatus 100. This state may be represented as, using the above-described lengths concerning the openings 104, Doo<2×Wo and Doe<2×Wo. The width Wo of the opening 104a may satisfy 50 µm≤Wo≤200 µm or 80 µm≤Wo≤120 µm. The width Wo may be 100 µm, for example. The distance Doo between the openings 104a and 104b may satisfy 50 µm≤Doo≤250 µm or 120 µm≤Doo≤160 µm. The distance Doo may be 140 µm, for example. In order to arrange a sufficient number of bonding portions 232 between the opening 104a and the opening 104b, Wo<Doo may be satisfied.

The width Wd of the bonding portion 232 may satisfy 1 µm≤Wd≤10 µm or 1 µm≤Wd≤5 µm. The width Wd may be 3 µm, for example. The distance Sd between the bonding portions 232 may satisfy 1 µm≤Sd≤10 µm or 1 µm≤Sd≤5 µm. The distance Sd may be 3 µm, for example. The sizes as described above facilitate the arrangement of the plurality of bonding portions 232 at a uniform density in a small region such as the region 601. With this arrangement, the bonding strength between the two semiconductor components 210 and 220 in the region 601 is increased. Further, from the viewpoint of the bonding strength between bonding faces 214 and 224, the density of the bonding portions 232 may be smaller than 0.3, that is, may satisfy $Wd^2/(Wd+Sd)^2<0.3$.

As has been described above, if Dod is too small, the internal space formed between the two semiconductor components 210 and 220 may communicate with the opening 104a. Therefore, Dod>Wd may be satisfied, or Dod≥Wd+Sd may be satisfied. Further, in order to increase the bonding strength in the vicinity of the opening 104a, Dod<Doe/4 or Dod<3×(Wd+Sd) may be satisfied. Dod≤2×(Wd+Sd) may be further satisfied. Furthermore, 3 µm≤Dod≤30 µm, 6 µm≤Dod≤20 µm, or 9 µm≤Dod≤12 µm may be satisfied. For example, when Wd=Sd=3 µm, if 9 µm≤Dod≤12 µm is satisfied, 1.5×(Wd+Sd)≤Dod≤2×(Wd+Sd) is satisfied. In order to arrange a sufficient number of bonding portions 232 between the opening 104a and the edge 101, Doe>10×(Wd+Sd) may be satisfied. For example, it is possible to arrange, between the opening 104a and the edge 101, five or more bonding portions 232 along the direction connecting the opening 104a and the edge 101. Further, it is possible to arrange, between the opening 104a and the edge 101, ten or more bonding portions 232 along the direction connecting the opening 104a and the edge 101.

Similarly, if Ded is too small, the internal space formed between the two semiconductor components 210 and 220 may communicate with the edge 101. Therefore, Ded>Wd may be satisfied, or Ded≥Wd+Sd may be satisfied. Further, in order to increase the bonding strength in the vicinity of the opening 104a, Ded<Doe or Ded<Doe/4 may be satisfied. Furthermore, in order to increase the bonding strength in the vicinity of the opening 104a, Ded<3×(Wd+Sd) or Ded<2×(Wd+Sd) may be satisfied. Furthermore, 3 µm≤Ded≤30 µm, 6 µm≤Ded≤20 µm, or 9 µm≤Ded≤12 µm may be satisfied. In order to arrange a sufficient number of bonding portions 232 between the opening 104a and the edge 101, Doe>10×(Wd+Sd) may be satisfied. For example, it is possible to arrange, between the opening 104a and the edge 101, five or more bonding portions 232 along the direction connecting the opening 104a and the edge 101. Further, it is possible to arrange, between the opening 104a and the edge 101, ten or more bonding portions 232 along the direction connecting the opening 104a and the edge 101.

As has been described above, according to this embodiment, it is possible to suppress the communication of the internal space with the opening 104a or the edge 101 caused by erosion while arranging the bonding portions 232 between two openings 104 adjacent to each other. Therefore, it is possible to suppress a deterioration of the bonding portions 232 caused by corrosion while improving the bonding strength between the two semiconductor components 210 and 220. As a result, it is possible to provide the high-quality and inexpensive semiconductor apparatus 600.

Third Embodiment

Figure 8:
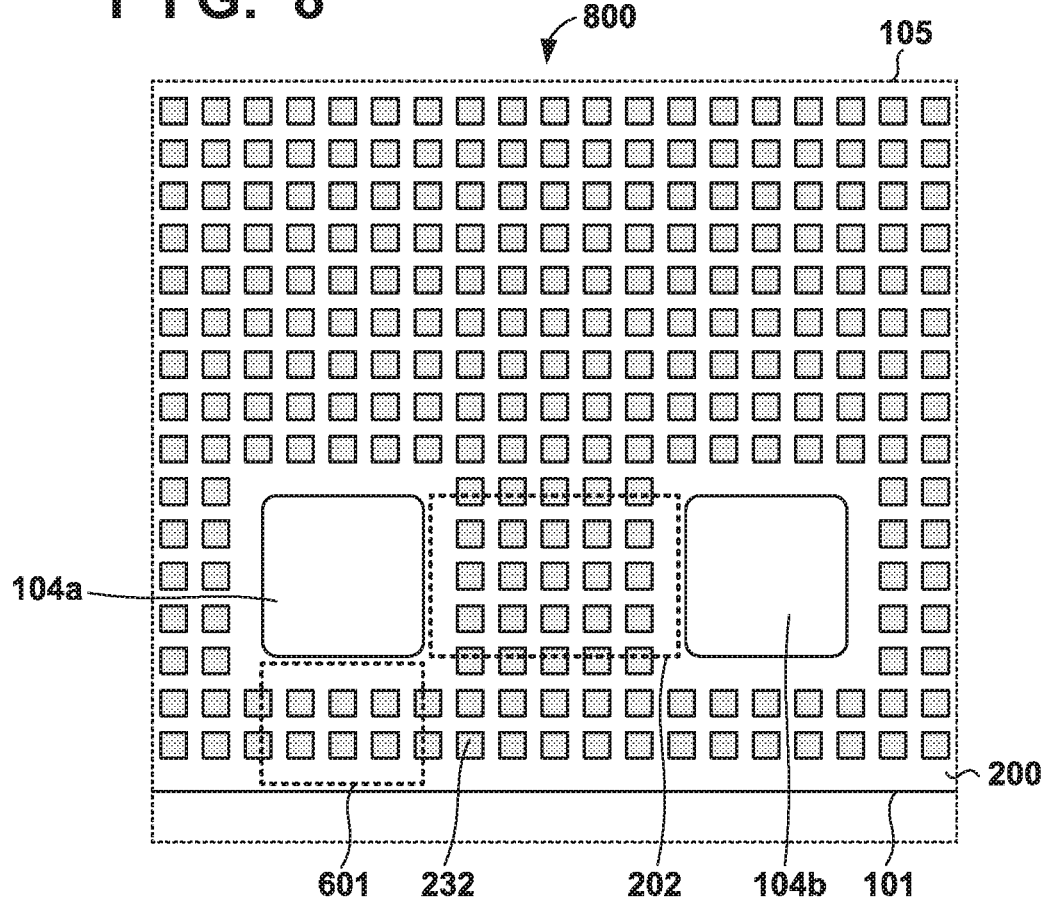
FIG. 8 is a schematic view for explaining an example of the structure of a semiconductor apparatus according to still another embodiment of the present disclosure.

With reference to FIG. 8, an example of the structure of a semiconductor apparatus 800 according to the third embodiment of the present disclosure will be described. A repetitive description of components of the semiconductor apparatus 800 similar to those of the semiconductor apparatus 100 or 600 will be omitted. That is, unless otherwise stated, the above description of the semiconductor apparatus 100 or 600 also applies to the semiconductor apparatus 800.

FIG. 8 shows the structure of the semiconductor apparatus 800 in the region 105 shown in FIG. 1 on a bonding face 200 between a semiconductor component 210 and a semiconductor component 220. A plurality of bonding portions 232 are arranged over the entire bonding face 200. For example, some of the plurality of bonding portions 232 are arranged in a region overlapping with the pixel region 102. Further, some of the plurality of bonding portions 232 are arranged in a region 202 between an opening 104a and an opening 104b. In addition, some of the plurality of bonding portions 232 are arranged in a region 601 between the opening 104a and an edge 101. Note that the plurality of bonding portions 232 are not arranged in the openings 104a and 104b and the vicinity thereof. Since the sectional structure of the semiconductor apparatus 800 is similar to those of the semiconductor apparatuses in the first and second embodiments, an illustration thereof will be omitted.

General Embodiment

The above-described first to third embodiments can be generalized as follows. The semiconductor apparatus includes a face (to be referred to as an intersection face hereinafter) intersecting with the bonding face 200. In the first embodiment, the intersection face is the face facing the opening 104 passing through the bonding face 200. In the second embodiment, the intersection face is the face facing the edge 101 of the semiconductor apparatus 600 or the opening 104 passing through the bonding face 200. Among the plurality of bonding portions 232, the bonding portion closest to the intersection face is referred to as a closest bonding portion. On the bonding face 200, if Wd represents the width of the closest bonding portion, Dfd represents the distance between the intersection face and the closest bonding portion, and Sd represents the interval between two adjacent bonding portions among the plurality of bonding portions 232, Wd<Dfd and/or Dfd<3×(Wd+Sd) is satisfied. Wd+Sd≤Dfd may be satisfied, or Dfd≤2×(Wd+Sd) may be satisfied. Dfd matches Dod (Dfd=Dod) in the first embodiment, and matches Dod or Ded (Dfd=Dod or Ded) in the second embodiment. In addition, if Dff represents the distance between two intersection faces facing each other via a part of the insulating layer, Dfd<Dff can be satisfied. Dff matches Doo (Dff=Doo) in the first embodiment, and matches Doe (Dff=Doe) in the second embodiment. FIG. 3 described in the first embodiment shows the distance Dfd between the edge 101 and the closest bonding portion with respect to the edge 101. In the relationship between the edge 101 and the closest bonding portion with respect to the edge 101, Wd<Dfd is satisfied, and Dfd<Dff (Dfd<Doe) is further satisfied. In the second embodiment, in the relationship between the edge 101 and the closest bonding portion with respect to the edge 101, Wd<Dfd and Dfd<Dff are satisfied, and Dfd<3×(Wd+Sd) is further satisfied.

Other Embodiments

An equipment 9191 including a semiconductor apparatus 930 shown in FIG. 9 will be described below in detail. The semiconductor apparatus 930 may be any of the above-described semiconductor apparatuses 100, 600, and 800. The semiconductor apparatus 930 can include a semiconductor device 910 and a package 920 that stores the semiconductor device 910. The package 920 can include a base on which the semiconductor device 910 is fixed, and a lid made of glass or the like facing the semiconductor device 910. The package 920 can further include bonding members such as a bonding wire and bump for connecting a terminal of the base and a terminal (the bonding pad 201a or 201b) of the semiconductor device 910.

The equipment 9191 can include at least any of an optical apparatus 940, a control apparatus 950, a processing apparatus 960, a display apparatus 970, a storage apparatus 980, and/or a mechanical apparatus 990. The optical apparatus 940 is implemented by, for example, a lens, a shutter, and a mirror. The control apparatus 950 controls the semiconductor apparatus 930. The control apparatus 950 is, for example, a semiconductor apparatus such as an ASIC.

The processing apparatus 960 processes a signal output from the semiconductor apparatus 930. The processing apparatus 960 is a semiconductor apparatus such as a CPU or ASIC for forming an AFE (Analog Front End) or a DFE (Digital Front End). The display apparatus 970 is an EL display apparatus or liquid crystal display apparatus that displays information (image) obtained by the semiconductor apparatus 930. The storage apparatus 980 is a magnetic device or semiconductor device that stores the information (image) obtained by the semiconductor apparatus 930. The storage apparatus 980 is a volatile memory such as an SRAM or DRAM or a nonvolatile memory such as a flash memory or hard disk drive.

The mechanical apparatus 990 includes a moving or propulsion unit such as a motor or engine. The equipment 9191 displays the signal output from the semiconductor apparatus 930 on the display apparatus 970 and performs external transmission by a communication apparatus (not shown) of the equipment 9191. For this purpose, the equipment 9191 may further include the storage apparatus 980 and the processing apparatus 960 in addition to the memory circuits and arithmetic circuits of the semiconductor apparatus 930. The mechanical apparatus 990 may be controlled based on the signal output from the semiconductor apparatus 930.

The equipment 9191 is suitable for an electronic equipment such as an information terminal (for example, a smartphone or a wearable terminal) having a shooting function, or a camera (for example, a lens interchangeable type camera, a compact camera, a video camera, or a surveillance camera). The mechanical apparatus 990 in the camera can drive the components of the optical apparatus 940 in order to perform zooming, an in-focus operation, and a shutter operation. Alternatively, the mechanical apparatus 990 in the camera can move the semiconductor apparatus 930 in order to perform an anti-vibration operation.

The equipment 9191 can also be a transportation equipment such as a vehicle, a ship, or a flying vehicle. The mechanical apparatus 990 in the transportation equipment can be used as a mobile apparatus. The equipment 9191 as the transportation equipment may transport the semiconductor apparatus 930, or assist and/or automate driving (steering) by a shooting function. The processing apparatus 960 for assisting and/or automating driving (steering) can perform processing for operating the mechanical apparatus 990 as a mobile apparatus based on the information obtained by the semiconductor apparatus 930. Alternatively, the equipment 9191 may be a medical equipment such as an endoscope, a measurement equipment such as an analysis distance measurement sensor, an analysis equipment such as an electron microscope, or an office equipment such as a copy machine.

The embodiments described above can be modified as appropriate without departing from the technical scope. The disclosure content of the present specification includes not only matters described in the present specification but also all matters that can be understood from the present specification and the attached drawings. The disclosure content of the present specification also includes a complement of the concept described in the present specification. That is, for example, if there is a description that "A is B" in the present specification, the present specification shall disclose that "A is not B" even if a description that "A is not B" is omitted. This is because, if the description "A is B" is provided, it is premised that a case of "A is not B" is considered.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-185458, filed Oct. 8, 2019, which is hereby incorporated by reference herein in its entirety.

What is claimed is:

1. A semiconductor apparatus comprising:
   a first semiconductor component including a first insulating layer and a first plurality of metal pads embedded in recess portions provided in the first insulating layer; and
   a second semiconductor component including a second insulating layer and a second plurality of metal pads embedded in recess portions provided in the second insulating layer;
   wherein the first semiconductor component and the second semiconductor component are stacked on each other, wherein the first insulating layer and the second insulating layer are bonded to each other;
   each of the first plurality of metal pads and each of the second plurality of metal pads are bonded to each other to form each of a plurality of bonding portions;
   a first opening and a second opening each passing through a bonding face between the first insulating layer and the second insulating layer are formed in the semiconductor apparatus;
   the semiconductor apparatus includes edges surrounding the plurality of bonding portions;
   the first opening and the second opening are arranged along an edge of the semiconductor apparatus;
   the plurality of bonding portions include a first bonding portion between the first opening and the second opening, and any of the plurality of bonding portions is not located between the first bonding portion and the first opening in a direction parallel to the edge; and
   on the bonding face, letting Wd be a width of the first bonding portion in the direction parallel to the edge, Wo be a width of the first opening in the direction parallel to the edge, Doo be a distance between the first opening and the second opening, Dod be a distance between the first opening and the first bonding portion, and Doe be a distance between the first opening and the edge, Doo<2×Wo, Doe<2×Wo, and Dod>Wd are satisfied.

2. The semiconductor apparatus according to claim 1, wherein letting Sd be an interval, on the bonding face between the first bonding portion and another bonding portion among the plurality of bonding portions adjacent to the first bonding portion in the direction parallel to the edge, Doo>10×(Wd+Sd) is further satisfied.

3. The semiconductor apparatus according to claim 1, wherein letting Sd be an interval on the bonding face between the first bonding portion and another bonding portion among the plurality of bonding portions adjacent to the first bonding portion, Dod<3×(Wd+Sd) is further satisfied.

4. The semiconductor apparatus according to claim 1, wherein Dod<Doo/4 is further satisfied.

5. The semiconductor apparatus according to claim 1, wherein the plurality of bonding portions include between the first opening and the second opening not less than five bonding portions arranged along a direction connecting the first opening and the second opening.

6. The semiconductor apparatus according to claim 1, wherein the first bonding portion is the bonding portion among the plurality of bonding portions closest to the first opening between the first opening and the second opening.

7. The semiconductor apparatus according to claim 1, wherein
the plurality of bonding portions include a second bonding portion between the first opening and the second opening, and any of the plurality of bonding portions is not located between the second bonding portion and the second opening, and
on the bonding face, letting Wd' be a width of the second bonding portion in the direction parallel to the edge, Wo' be a width of the second opening in the direction parallel to the edge, Dod' be a distance between the second opening and the second bonding portion, and Doe' be a distance between the second opening and the edge,
Doo'<2×Wo', Doe'<2×Wo', and Dod'>Wd' are satisfied.

8. The semiconductor apparatus according to claim 7, wherein the second bonding portion is the bonding portion among the plurality of bonding portions closest to the second opening between the first opening and the second opening.

9. The semiconductor apparatus according to claim 1, wherein Wo<Doo is further satisfied.

10. The semiconductor apparatus according to claim 1, wherein on the bonding face, letting Wd" be a width of one bonding portion among the plurality of bonding portions in a direction perpendicular to the edge, Dfd be a distance between the edge and the one bonding portion, and Sd be an interval between the one bonding portion and the bonding portion among the plurality of bonding portions, adjacent to the one bonding portion,
Wd"<Dfd is satisfied.

11. The semiconductor apparatus according to claim 1, wherein Wd$^2$/(Wd+Sd)$^2$<0.3 is further satisfied.

12. The semiconductor apparatus according to claim 1, wherein 50 µm≤Wo≤200 µm and 1 µm≤Wd≤10 µm are further satisfied.

13. The semiconductor apparatus according to claim 1, wherein the semiconductor apparatus is a photoelectric conversion apparatus.

14. An equipment comprising:
the semiconductor apparatus according to claim 1; and
at least any of six apparatuses including
an optical apparatus corresponding to the semiconductor apparatus,
a control apparatus configured to control the semiconductor apparatus,
a processing apparatus configured to process information obtained by the semiconductor apparatus,
a display apparatus configured to display information obtained by the semiconductor apparatus,
a storage apparatus configured to store information obtained by the semiconductor apparatus, and
a mechanical apparatus configured to operate based on information obtained by the semiconductor apparatus.

15. A semiconductor apparatus comprising:
a first semiconductor component including a first insulating layer and a first plurality of metal pads embedded in recess portions provided in the first insulating layer; and
a second semiconductor component including a second insulating layer and a second plurality of metal pads embedded in recess portions provided in the second insulating layer;
wherein the first semiconductor component and the second semiconductor component are stacked on each other, wherein the first insulating layer and the second insulating layer are bonded to each other;
each of the first plurality of metal pads and each of the second plurality of metal pads are bonded to each other to form each of a plurality of bonding portions;
an opening passing through a bonding face between the first insulating layer and the second insulating layer is formed in the semiconductor apparatus;
the semiconductor apparatus includes edges surrounding the plurality of bonding portions;
the plurality of bonding portions include a first bonding portion between the opening and an edge, and any of the plurality of bonding portions is not located between the first bonding portion and the opening in a direction perpendicular to the edge; and
on the bonding face, letting Wd be a width of the first bonding portion in the direction perpendicular to the edge, Wo be a width of the opening in the direction perpendicular to the edge, Doe be a distance between the opening and the edge, and Dod be a distance between the opening and the first bonding portion,
Doe<2×Wo and Dod>Wd are satisfied.

16. The semiconductor apparatus according to claim 15, wherein letting Sd be an interval on the bonding face between the first bonding portion and another bonding portion among the plurality of bonding portions adjacent to the first bonding portion, Doe>10×(Wd+Sd) is further satisfied.

17. The semiconductor apparatus according to claim 15, wherein letting Sd be an interval on the bonding face between the first bonding portion and another bonding portion among the plurality of bonding portions adjacent to the first bonding portion in the direction perpendicular to the edge, Dod<3×(Wd+Sd) is further satisfied.

18. The semiconductor apparatus according to claim 15, wherein Dod<Doe/4 is satisfied.

19. The semiconductor apparatus according to claim 15, wherein the plurality of bonding portions include between the opening and the edge not less than five bonding portions arranged along a direction connecting the opening and the edge.

20. The semiconductor apparatus according to claim 15, wherein the first bonding portion is the bonding portion among the plurality of bonding portions closest to the opening between the opening and the edge.

21. The semiconductor apparatus according to claim 15, wherein the plurality of bonding portions include a second bonding portion between the opening and the edge, and any of the plurality of bonding portions is not located between the second bonding portion and the edge, and on the bonding face, letting Wd' be a width of the second bonding portion in the direction perpendicular to the edge, Ded be a distance between the edge and the second bonding portion, and Sd' be an interval between the second bonding portion and a bonding portion among the plurality of bonding portions, adjacent to the second bonding portion, Ded<3×(Wd'+Sd') is further satisfied.

\* \* \* \* \*